US012389541B2

(12) United States Patent
Adair et al.

(10) Patent No.: US 12,389,541 B2
(45) Date of Patent: Aug. 12, 2025

(54) PRINTED CIRCUIT BOARD WITH NFC-ANTENNA

(71) Applicant: JT International SA, Geneva (CH)

(72) Inventors: Kyle Adair, Lisburn (GB); Olayiwola Olamiposi Popoola, Walton-on-Thames (GB); Peter Loveday, Epsom (GB)

(73) Assignee: JT International S.A. (CH)

( * ) Notice: Subject to any disclaimer, the term of this patent is extended or adjusted under 35 U.S.C. 154(b) by 203 days.

(21) Appl. No.: 18/277,733

(22) PCT Filed: Feb. 8, 2022

(86) PCT No.: PCT/EP2022/052993
§ 371 (c)(1),
(2) Date: Aug. 17, 2023

(87) PCT Pub. No.: WO2022/175133
PCT Pub. Date: Aug. 25, 2022

(65) Prior Publication Data
US 2024/0138068 A1 Apr. 25, 2024
US 2024/0237213 A9 Jul. 11, 2024

(30) Foreign Application Priority Data

Feb. 19, 2021 (EP) .................................. 21158117

(51) Int. Cl.
*H05K 1/14* (2006.01)
*A24F 40/40* (2020.01)
(Continued)

(52) U.S. Cl.
CPC ............. *H05K 1/147* (2013.01); *A24F 40/40* (2020.01); *A24F 40/465* (2020.01);
(Continued)

(58) Field of Classification Search
CPC ....... H05K 1/147; H05K 1/165; H05K 3/4691
See application file for complete search history.

(56) References Cited

U.S. PATENT DOCUMENTS

2014/0224267 A1* 8/2014 Levitz ..................... A24F 40/40
320/108
2015/0116156 A1* 4/2015 Chen ..................... H01Q 23/00
343/700 MS (Continued)

FOREIGN PATENT DOCUMENTS

WO 2020257334 A1 12/2020

OTHER PUBLICATIONS

International Search Report for PCT/EP2022/052993 mailed Jun. 10, 2022. 3 pages.

*Primary Examiner* — Sherman Ng
(74) *Attorney, Agent, or Firm* — Lerner David LLP

(57) ABSTRACT

A printed circuit board mechanically supports electrical and/or electronic components for an electronic smoking article. The board includes at least one flexible portion and at least one rigidized portion, wherein the flexible portion and the rigidized portion include a common flexible layer stack including at least one structured metal layer. The rigidized portion further includes at least one rigidizing layer stack including at least one structured metal layer, wherein the rigidizing layer stack is arranged on at least one surface of the common flexible layer stack. At least a part of the structured metal layer of the common flexible layer stack in the flexible portion is structured as an electromagnetic coil forming an NFC-antenna and at least a part of the respective structured metal layers of the common flexible layer stack and the rigidizing layer are structured for acting together as an electromagnetic induction coil suitable for wireless charging.

20 Claims, 3 Drawing Sheets

(51) Int. Cl.
  *A24F 40/465*  (2020.01)
  *H01F 27/28*   (2006.01)
  *H01F 38/14*   (2006.01)
  *H05K 1/11*    (2006.01)
  *H05K 3/46*    (2006.01)

(52) U.S. Cl.
  CPC ......... *H01F 27/2804* (2013.01); *H01F 38/14* (2013.01); *H05K 1/115* (2013.01)

(56) References Cited

U.S. PATENT DOCUMENTS

2018/0316782 A1* 11/2018 Choi ............... H04M 1/026
2020/0411989 A1* 12/2020 Oh .................. H01Q 1/38
2021/0153562 A1*  5/2021 Fishwick .......... A24F 40/65

* cited by examiner

PRINTED CIRCUIT BOARD WITH NFC-ANTENNA

CROSS-REFERENCE TO RELATED APPLICATIONS

The present application is a national phase entry under 35 U.S.C. § 371 of International Application No. PCT/EP2022/052993, filed Feb. 8, 2022, published in English, which claims priority to European Application No. 21158117.8 filed Feb. 19, 2021, the disclosures of which are incorporated herein by reference.

FIELD OF THE INVENTION

The present invention relates to a printed circuit board, which mechanically supports a plurality of electrical and/or electronic components and is insertable in an electronic smoking device. The mentioned printed circuit board comprises at least one flexible portion including an NFC-antenna and at least one rigidized portion, wherein both portions are attached on a common flexible layer stack.

BACKGROUND

Electronic smoking devices are gaining increasing popularity in particular for consumption of nicotine, tobacco, liquid flavoring substances and other smokable plant based materials. These devices are often anatomically shaped in such a way that a housing is particularly comfortable in the user's hand. Due to this, the electrical smoking devices are handheld and mobile. To achieve wireless capability, typically already tuned antenna are connected to the flexi-rigid PCB using connectors and/or flying leads. For example, in US2014224267 describes an in-ductive charging system for wireless charging of an electrical cigarette. Therefore, the described electric cigarette comprises a flexible laminate printed circuit board (PCB) in which the receiving coils are printed. An another example of an wireless module for handheld electronic devices with the wireless modules for charging is US2015116156. However, the common PCBs are not flexible enough for use in the particularly thin and filigree embodiments of the handheld electrical cigarettes. Furthermore the such implementations of the wireless charging modules increase the producing costs and degrade variability of design caused by an extra set of assembly steps.

It would be desirable to provide a flexible printed circuit board with integrated antenna as part of a single flexible printed circuit board for installation in an electronic smoking device. It would be particularly desirable to reduce the manufacturing costs and assembly steps of such flexible printed circuit board.

SUMMARY

It is therefore the objective of the invention to provide a flexible printed circuit board with all wireless antennae integrated on the mentioned flexible printed circuit board.

The afore mentioned problems are solved by a printed circuit board mechanically supporting a plurality of electrical and/or electronic components for an electronic smoking article, which are electrically connected via conductive tracks. The printed circuit board comprises at least one flexible portion and at least one rigidized portion, wherein the flexible portion and the rigidized portion comprise a common flexible layer stack comprising at least one structured metal layer, which forms conductive tracks and/or electrical components. The rigidized portion further comprises at least one rigidizing layer stack comprising at least one structured metal layer, which forms conductive tracks and/or electrical components, wherein the rigidizing layer stack is arranged on at least one surface of the common flexible layer stack. According to the invention, at least a part of the structured metal layer of the common flexible layer stack in the flexible portion is structured as an electromagnetic coil forming an NFC-antenna and at least a part of the respective structured metal layers of the common flexible layer stack and the rigidizing layer are structured for acting together as an electromagnetic induction coil suitable for wireless charging.

Preferably the rigidness of the printed circuit board can be defined by a number of layers. It is possible to provide a two-layer portion on each surface of the printed circuit board, which is preferably flexible. It is also conceivable to provide a four-layer portion on each surface of the printed circuit board, which is particularly less flexible as two-layer portion. The term flexible is in this context meant as especially bendable. The flexibility of the printed circuit board is advantageous particularly for attaching this in a housing of the electrical smoking device. This way especially large amount of space can be utilized at the edges of the housing, in case of its square shape. Also in case of rounded shape or for a user personally modulated shape of the housing, the flexibility of the flexible portion of the printed circuit board is very advantageous.

It is advantageous to attach the NFC-antenna at the flexible portion of the common flexible layer stack particularly for automated manufacturing process of the whole printed circuit board. It is possible to modulate the coil by leaving internal layers of the flexible portion from the printed circuit board stack up empty. This eliminates adding of separate electromagnetic coil forming components to the printed circuit board, what especially reduces the product cost. Preferably the flexible portion of the common flexible layer stack comprises at least two layers. The first flexible layer is preferably a top and/or bottom paste and is attached to a second flexible layer. Preferably the second layer is a dielectric layer, more preferably a second and/or fourth dielectric layer, which is attached to the common flexible layer stack. The common flexible layer stack preferably comprises a flexible core comprising polyimide. It is possible that the top and bottom flex are designed as antenna artwork. For example, a coil shaped pattern could be generated on the flexible portion with a design tool before or during printing the printed circuit board. During designing it is conceivable to change physical values of the coil, such as length and width of the coil, track width, size of a gap between the tracks, track thickness and number of turns. It is conceivable that thereby formed coil is further coated with at least one dielectric layer and/or a top paste on each surface of the printed circuit board. Preferably the dielectric layer is a prereg 1080.

It is possible that the coil shaped pattern generated with the design tool does not work automatically in a desired manner. To provide a plausible pattern, it is conceivable to connect the pattern with a Vector Network Analyser tool for measuring the antenna's real values, such as impedance. Preferably the values of antenna pattern are calculated for a desired frequency. The calculation enables consistency of coils performance, homogeneity and reduces manufacturing costs.

In a preferred embodiment the NFC-antenna is square shaped. The antenna preferably comprises a lateral length and width in range of 30 mm and 90 mm, preferably 65 mm. The antenna preferably comprises a track width in range of 300 μm and 600 μm, preferably 500 μm. It is possible that the NFC-antenna further comprises at least one gap between the tracks in range of 300 μm and 600 μm, preferably 500 μm. It is conceivable that the track thickness is 35 μm and a number of turns is 2. Such NFC-antenna is preferably suitable for high frequency transmission, preferably in range of 10 MHz to 90 MHz, more preferred 13.56 MHz. Preferably the NFC-antenna enables data transfer rate up to 424 kBit/s.

It is also advantageous to attach the electromagnetic induction coil at least partially on the rigidizing layer for being suitable for wireless charging. Preferably the electromagnetic induction coil is able to transfer a low frequency in range of 100 to 300 KHz for the wireless charging. Due to this, it is conceivable that the electromagnetic induction coil requires a thicker and longer copper gauge unlike the NFC-antenna. To achieve this, it is possible to use all layers of the flexible printed circuit board and copper stitch the layers together to get a 3D conductor similar to a wire. To achieve the transreceiving of the frequency up to 100 KHz, the rigidized portion of the printed circuit board might comprise at least 6 layers on each surface. Preferably the rigidized portion comprises a top and bottom solder layer, a top and bottom overlay, a top and bottom rigid layer, a first and fifth dielectric layer, a ground layer (GND) and a voltage supply (Vsupp) layer and a second and fourth dielectric layer. Preferably the rigidized and flexible portion of the printed circuit board together comprise a top and bottom paste.

According to another embodiment, the printed circuit board is characterized in that the common flexible layer stack and the rigidizing layer are interconnected with vias. Interconnection with vias is in particular cheap and easy to implement. Due to the fact that the flexible printed circuit board only carries at least few electrical components, there is enough space for via stitching preferably in the rigidized portions.

According to another embodiment, the printed circuit board is characterized in that it further comprises a wireless protocol antenna suitable for transreceiving electromagnetic signals comprising a frequency of 2.4 GHz. Preferably the wireless protocol antenna transceives Bluetooth, WI-Fi, Zigbee, Thread and others. Preferably the wireless protocol antenna is applied on at least one surface of the rigidized portion of the printed circuit board. Also preferably the wireless protocol antenna is a chip antenna for ultra-high-frequencies.

According to another embodiment, the printed circuit board is characterized in that it is foldable into a rectangular shape having two shorter sides and two longer sides, wherein the NFC-antenna borders on one of the shorter sides. The most commonly used shape of the electronic smoking article preferably resembles a rectangular pen. To achieve attaching of the printed circuit board including the components into the housing, it is conceivable that the printed circuit board is foldable into rectangular shape with two shorter and two longer sides. Due to this it is advantageous to attach the NFC-antenna to a shorter side of the rectangular pen. In this case the NFC-antenna is preferably near to an exchangeable mouthpiece. It is possible that the said exchangeable mouthpiece is in communication to the electronic smoking article via NFC-antenna. Preferably the mouthpiece comprises an exchangeable cartridge with smokable liquid.

According to another embodiment, the printed circuit board is characterized in that it is foldable into a rectangular shape having two shorter sides and two longer sides, wherein the induction coil is arranged in the center between the shorter sides. Modulating or arranging the induction coil for wireless charging in the center and/or between two short sides of the rigidized portion is particularly advantageous. In this case, the already assembled electronic smoking article is preferably chargeable at a center of the charging station. The user preferably does not have to pay attention to positioning of the electrical smoking article, for example, whether induction coil touches the charging station at a certain position, but will automatically and intuitively place the device in the middle. Additionally or alternatively, it is conceivable that the NFC-antenna is arranged or modulated to one of the shorter sides.

According to another embodiment, the printed circuit board is characterized in that the vias are stitching vias. Preferably the stitching vias stitch at least two metal layers together. Stitching vias are advantageous for ensuring short return paths for signals. It is conceivable that the stitching vias distribute heat on the printed circuit board. It is especially advantageous at the portions with induction coil. In this case the printed circuit board is more conductive horizon-tally, wherein the heat is carried out at least sideways. Due to this the common flexible layer stack might be cooler than the traces, wherein the stitching vias through the rigidized portions produce more through-plane conductivity which carries and dissipates heat to the common flexible stack. It is also conceivable to use the effect of fencing electromagnetic waves radiating from the tracks at high frequencies. Preferably the vias are spaced to each other at a minimum $1/10^{th}$ of the wavelength of the frequency of interest. In this case the spacing is small enough to fence the impinging waves.

According to another embodiment, the printed circuit board is characterized in that the rigidized portion further comprises a second rigidizing layer stack comprising at least one structured metal layer, which forms conductive tracks and/or electrical components, wherein at least a part of the respective structured metal layers of the common flexible layer stack and the two rigidizing layers are interconnected with vias and structured for acting together as the induction coil. It is conceivable that the conductive tracks electrically connect the electrical components to each other and/or to at least one antenna. Preferably the induction coil is arranged at least partially on the flexible layer stack. It is possible that the induction coil arranged on at least two rigidized layer stacks and on the flexible layer stack is bendable to an angle in range of 25° to 160°. The electrical smoking article with printed circuit board modulated in such a way might comprise the induction coil for wireless charging on at least one edge.

According to another embodiment, the printed circuit board is characterized in that the common flexible layer stack and the two rigidizing layer stacks each comprise two structured metal layers, which are all interconnected with vias and structured for acting together as the induction coil. Preferably such induction coil is foldable in an angle in range of 30° to 130°. In case of use different frequencies for communication with other devices and/or wireless power transmission, it would be desirable to attach at least three, more preferred four antennas. The number of used induction coils which are structured and comprised in at least two rigidizing layer stacks varies depending on the required number of communication frequencies and/or wireless power transmission frequencies.

According to another embodiment, the printed circuit board is characterized in that the induction coil comprises a surface area of 400-500 mm², preferably 430-470 mm², most preferred 450 mm². Preferably the width of the designed induction coil is 15 mm and the length 30 mm. It is also possible that the width of the designed induction coil is in range of 5 mm to 30 mm and the length is in range of 10 mm to 47 mm.

According to another embodiment, the printed circuit board is characterized in that the induction coil comprises an overall cross-sectional area of an effective wire formed by the interconnected structured metal layers of 0.05-0.3 mm², preferably 0.01-0.25 mm², most preferred 0.2 mm². Preferably the induction coil has a diameter of 0.5 mm with 0.2 mm² cross-sectional area. For such a coil the track with a width of 1 mm on all layers, preferably six layers, and a height of 0.1 mm is required.

According to another embodiment, the printed circuit board is characterized in that the metal layers are copper layers. It is also possible to use other electrically conductive metals.

According to another embodiment, the printed circuit board is characterized in that the copper layers are ½ oz copper layer, i.e. they comprise a layer thickness of 18 μm. It is conceivable to combine the copper layers to a 3 oz copper layer.

Preferably the thickness of the top flex layer and the bottom flex layer is in range of 0.01 mm to 0.03 mm, more preferred 0.018 mm. Also preferably the thickness of the flexible core is in range of 0.01 mm to 0.1 mm, more preferred 0.05 mm.

Preferably the thickness of the top and bottom solder is in range of 0.02 mm to 0.03 mm, more preferred 0.025 mm. The thickness of the top and bottom rigid comprising copper layer is preferably in range of 0.01 mm to 0.03 mm, more preferred 0.018 mm. Preferably the thickness of the first and fifth dielectric layer is in range of 0.1 mm to 0.2 mm, more preferred 0.15 mm. Also preferably the thickness of the GND layer and the Vsupp layer is in range of 0.01 mm and 0.03 mm, more preferred 0.018 mm. The thickness of the second and fourth dielectric layer is in range of 0.05 mm to 0.09 mm, more preferred 0.068 mm.

According to another embodiment, the printed circuit board is characterized in that the NFC-antenna comprises a surface area of 200-250 mm², preferably 215-235 mm², most preferred 225 mm². The surface area of the NFC-antenna may vary depending on given area of the flexible portion or other values.

According to another embodiment, the printed circuit board is characterized in that the NFC-antenna comprises a width measured parallel to the shorter sides of 10-20 mm, preferably 13-17 mm, most preferred 15 mm. The width of the NFC-antenna may vary depending on the individual requirements such as desired frequency and/or given area of the flexible portion. It is also conceivable that the NFC-antenna comprises the width measured parallel to the shorter sides of 65 mm.

According to another embodiment, the printed circuit board is characterized in that the induction coil comprises a width measured parallel to the shorter sides of 10-20 mm, preferably 13-17 mm, most preferred 15 mm. The width of induction coil may vary depending on the individual requirements such as given arranging area.

BRIEF DESCRIPTION OF THE DRAWINGS

Further advantages, objectives and features of the present invention will be described, by way of example only, in the following description with reference to the appended figures. In the figures, like components in different embodiments can exhibit the same reference symbols.

The figures show.

DETAILED DESCRIPTION

Figure 1:
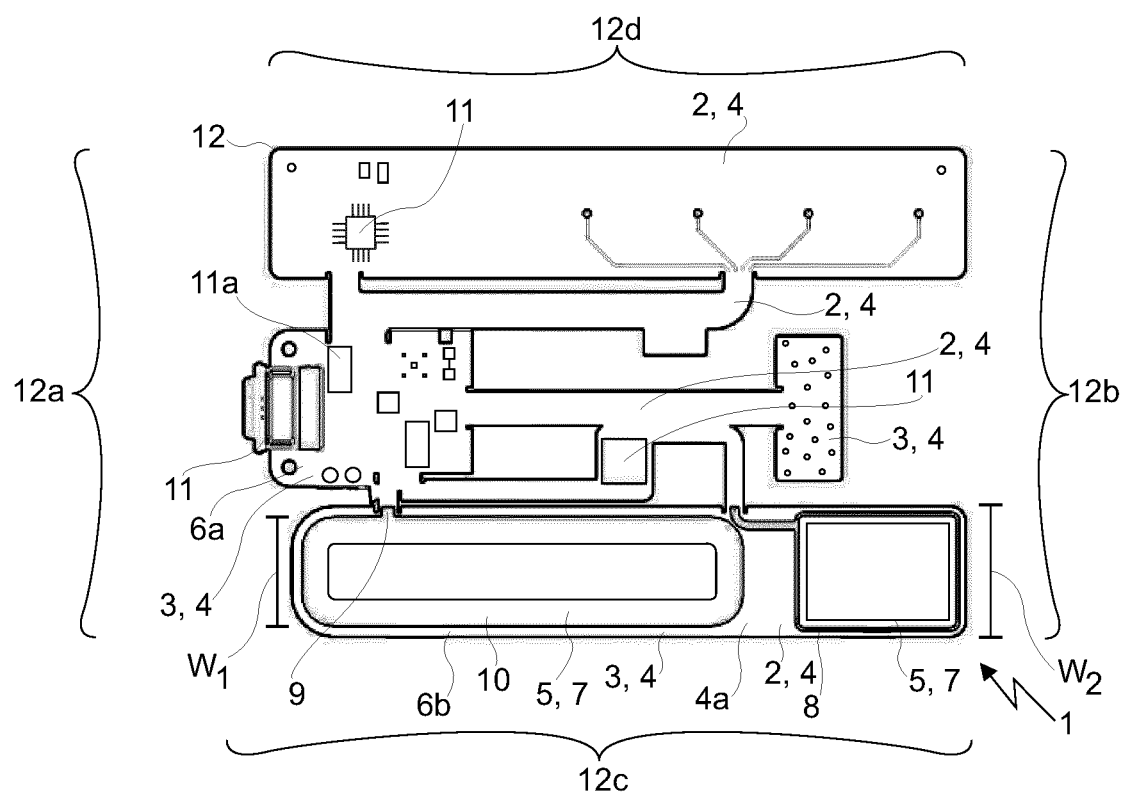
FIG. 1a top view of a printed circuit board with an induction coil, a wireless protocol antenna and a NFC-antenna.

FIG. 1 shows a top view of a printed circuit board 1 with an induction coil 10, wireless protocol antenna 11a and a NFC-antenna 8. The shown printed circuit board 1 is foldable and insertable into a housing of the electronic smoking article (shown in FIG. 3). Preferably the printed circuit board 1 further comprises two shorter sides 12a, b and two longer sides 12c, d, wherein on at least one of the shorter sides 12a, b a mouthpiece is arrangeable (not shown here). The printed circuit board 1 comprises rigidized 3 and flexible 2 portions, wherein both are arranged on at least one surface 4a, b of the common flexible layer stack.

The flexible 2 and the rigidized 3 portions further comprise structured metal layers 5, 7 acting as NFC-antenna 8 and an induction coil 10. Preferably the structured metal layers 5, 7 comprise copper. In the shown embodiment one metal layer 5, 7 comprised in the flexible portion 2 is formed to an ulam spiral, wherein the metal layers 5, 7 comprise at least one track ex-tends around a center bent at a 90° angle. It is conceivable that the width of the NFC-antenna W2 measured along the short side 12a, b is in range of 10 mm and 30 mm. Preferably the structured metal layer 5, 7 comprised in the rigidized portion 3 is formed to a spiral. The metal layers 5, 7 comprise at least one track extending around a center. It is possible that the width of the induction coil W1 measured along the short side 12a, b is in range of 10 mm and 30 mm.

In most embodiments additionally to the antennas 8, 10, 11a, the printed circuit board 1 supports a plurality of electrical and/or electronic components 11. All components 11, 8, 10, 11a preferably act together and enable different functions such as wireless charging, transceiving of ultra-high-frequencies and/or near field communication. Preferably the some layers of the rigidizing 6 and flexible 4 layer stacks comprise vias which stitch the internal metal layers. Also preferably, the induction coil 10 is modulated and stitched with vias 9 forming a 3D conductor, preferably a wire.

The wireless protocol antenna 11a is preferably arrangeable on at least one surface 4a, b of the printed circuit board 1. In FIG. 1, the wireless protocol antenna 11a is arranged at first rigidizing layer stack 6a near to the short side 12a. The NFC-antenna 8 is preferably arranged on the flexible layer stack 4 near to the shorter side 12b of the printed circuit board 1. The induction coil 10 is arranged on a second rigidizing layer stack 6b near to the shorter side 12a. It is conceivable that the induction coil 10 is arrangeable in the center between two short sides 12a, b (shown in FIG. 3).

Figure 2A:
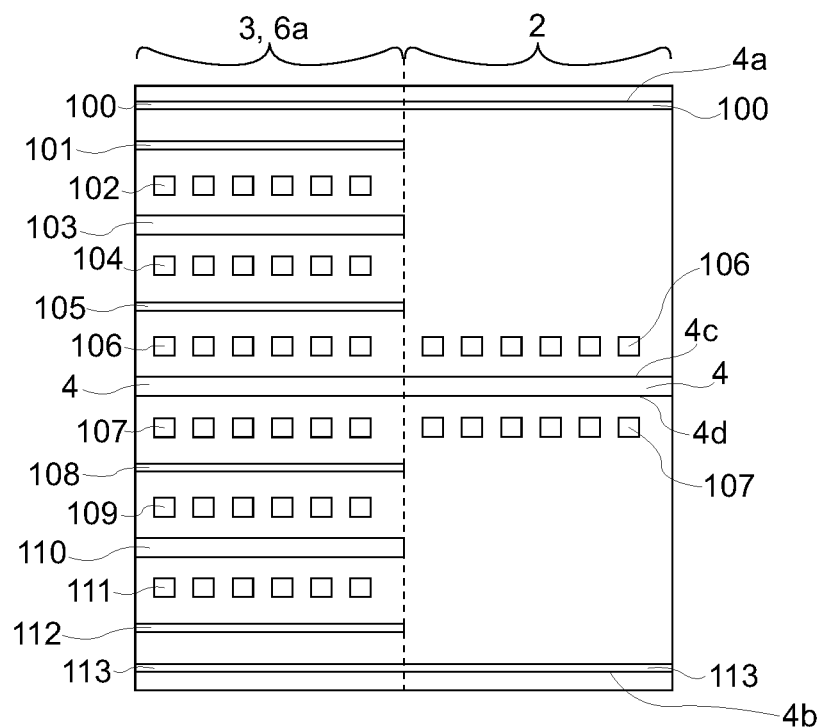
FIG. 2a a lateral view of the rigidized and flexible portions of the printed circuit board.

FIG. 2a shows a lateral view of the rigidized 3 and flexible 2 portions of the printed circuit board 1. The shown printed circuit 1 comprises a layered structure on the top and bottom surfaces 4a, b. The rigidized 3 and flexible 2 portions are attached on a common flexible layer stack 4. Preferably the top surface 4a at the rigidized portion 3 comprises a top paste 100, a top overlay 101, a top solder 102, a top rigid 103, a dielectric 1 104, a GND layer 105 and a dielectric 2 106. Also preferably the bottom surface 4b at the rigidized portion 3 comprises a bottom paste 113, a bottom overlay 112, a bottom solder 111, a bottom rigid 110, a dielectric 5 109, a Vsupp layer 108 and a dielectric 4 107.

Preferably the top 102 and bottom 111 solder comprise solder resist. The thickness of the top 102 and bottom 111 solder is preferably 0.025 mm. The top 103 and bottom 110 rigid preferably comprise copper. Preferably the thickness of the top 103 and bottom 110 rigid is 0.018 mm. The dielectric 1 104 and dielectric 5 109 comprise high Tg FR4 core. Preferably the thickness of the dielectric 1 104 and dielectric 5 109 is 0.150 mm. The GND layer and Vsupp layer preferably comprise copper or other metal layer. The thickness of GND layer and Vsupp layer is preferably 0.018 mm. The dielectric 2 106 and dielectric 4 107 preferably comprise prepreg 1080. The thickness of dielectric 2 106 and dielectric 4 107 is 0.068 mm. The common flexible layer stack 4 comprises a flex core, top 4c and bottom 4d flex. Preferably the thickness of the top and bottom flex 4c, d is 0.018 mm and the thickness of the flex core 4 is 0.05 mm. Preferably the top and bottom flex 4c, d comprise copper or other metal layer. Also preferably the flex core 4 comprises polyimide.

Figure 2B:
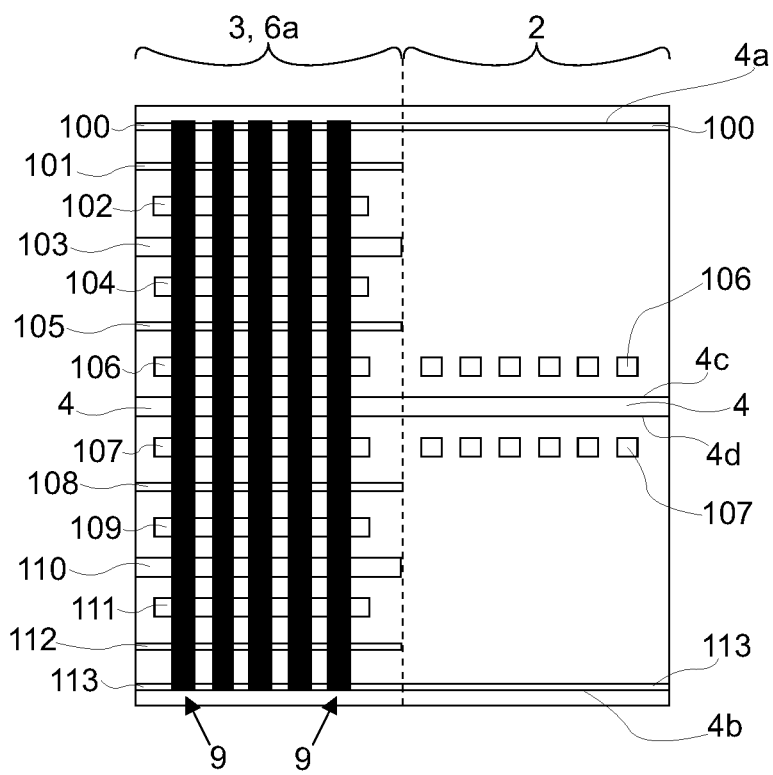
FIG. 2b a lateral view of the rigidized and flexible portions of the printed circuit board with stitching vias.

FIG. 2b shows a lateral view of the rigidized 3 and flexible 2 portions of the printed circuit board 1 with stitching vias 9. The printed circuit board 1 comprises the same layered structure as described in FIG. 2a. Additionally to this, the layers are stitched with vias 9. Preferably the rigidized 3 and/or flexible 2 portion comprise blind holes with a diameter in range of 50 μm and 10 μm. These holes are preferably made with a laser or are plasma-etched on at least one surface 4a, b. Preferably the holes extend until the GND layer 105, the top flex 4c, the bottom flex 4d, the Vsupp layer 108 or the bottom rigid 110. Preferably the holes are cleaned out of remaining resin and filled with metal, preferably copper, to interconnect electrically the layers. Due to this, stitching vias are preferably electroplated and with metal filled holes through the layers of the printed circuit board 1.

Figure 3:
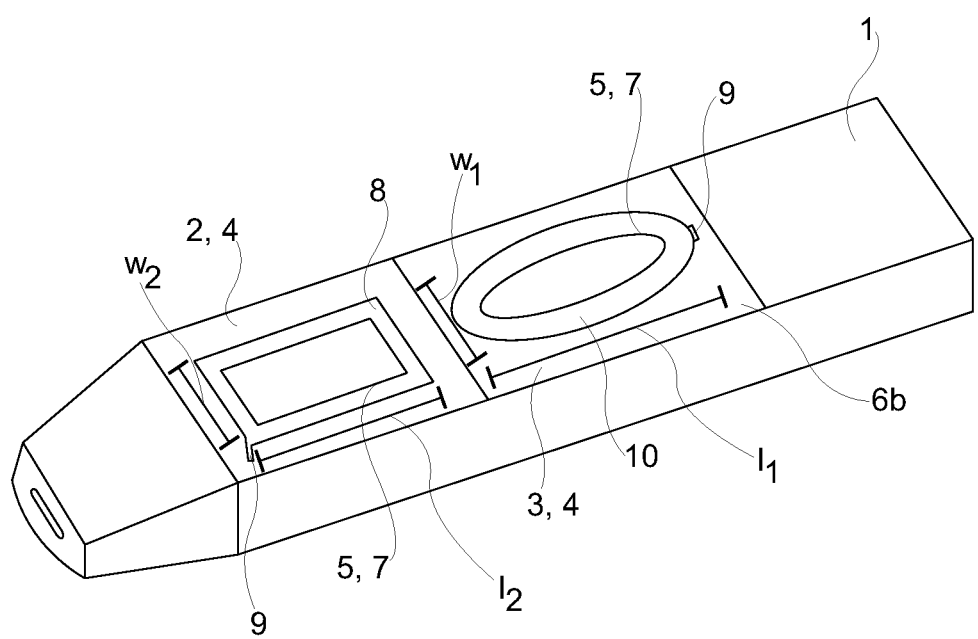
FIG. 3 a schematic view of an electronic smoking article comprising the printed circuit board.

FIG. 3 shows a schematic view of an electronic smoking article comprising the printed circuit board 1. The printed circuit board 1 further comprises an induction coil 10 and an NFC-antenna 8. Both antennas 10, 8 are preferably structured in the layers 5, 7 of the printed circuit board 1 comprising metal and vias (not shown). The induction coil 10 is preferably arranged on at least one rigidized portion 3 being a first 6a and/or second 6b rigidizing layer stack. The NFC-antenna 8 is preferably arranged on at least one flexible portion 2 being a flexible layer stack 4. In this embodiment the induction coil 10 is arranged between two flexible portions 2. The NFC-antenna 8 is preferably arranged on at least one flexible portion 2 of the printed circuit board 1.

The induction coil 10 comprises a width W1 and a length L1. Preferably the width W1 is in range of 5 mm and 35 mm and the length L1 in range of 10 mm and 45 mm. The NFC-antenna 8 comprises a width W2 and Length L2. Preferably the width W2 is in range of 5 mm and 35 mm and the Length L2 in range of 10 mm and 45 mm. It is also conceivable that the width W1 or W2 and length L1 or L2 varies depending on variables such as number of layers and number of required track turns. It is conceivable that the length L2 and the width W2 are similar to length L1 and width W1 of the induction coil 10.

The applicant reserves his right to claim all features disclosed in the application document as being an essential feature of the invention, as long as they are new, individually or in combination, in view of the prior art. Furthermore, it is noted that in the figures features are described, which can be advantageous individually. Someone skilled in the art will directly recognize that a specific feature being disclosed in a figure can be advantageous also without the adoption of further features from this figure. Furthermore, someone skilled in the art will recognize that advantages can evolve from a combination of diverse features being disclosed in one or various figures.

LIST OF REFERENCE SYMBOLS 1 printed circuit board
2 flexible portion
3 rigidized portion
4 common flexible layer stack/flex core
4a, b surface of the common flexible layer stack
4c, d top and bottom flex
5 structured metal layer
6 rigidizing layer stack
6a first rigidizing layer stack
6b second rigidizing layer stack
7 structured metal layer
8 NFC-antenna
9 vias
10 electromagnetic coil/induction coil
11 electrical and/or electronical components
11a wireless protocol antenna
12 rectangular shape
12a,b two shorter sides
12c, d two longer sides
W1 width of the induction coil
W2 width of the NFC-antenna
L1 length of the induction coil
L2 length of the NFC-antenna
100 top paste
101 top overlay
102 top solder
103 top rigid
104 dielectric 1
105 GND layer
106 dielectric 2
107 dielectric 4
108 Vsupp layer
109 dielectric 5
110 bottom rigid
111 bottom solder
112 bottom overlay
113 bottom paste

The invention claimed is:

1. A printed circuit board mechanically supporting a plurality of electrical and/or electronic components for an electronic smoking article, which are electrically connected via conductive tracks, wherein the printed circuit board comprises at least one flexible portion and at least one rigidized portion, wherein the at least one flexible portion and the at least one rigidized portion comprise a common flexible layer stack comprising at least one structured metal layer, which forms conductive tracks and/or electrical components, and the at least one rigidized portion further comprises at least one rigidizing layer stack comprising at least one structured metal layer, which forms conductive tracks and/or electrical components, wherein the at least one rigidizing layer stack is arranged on at least one surface of the common flexible layer stack, wherein at least a part of the at least one structured metal layer of the common flexible layer stack in the flexible portion is structured as an electromagnetic coil forming an NFC-antenna and at least a part of the respective at least one structured metal layers of the common flexible layer stack and the rigidizing layer stack are structured for acting together as an electromagnetic induction coil suitable for wireless charging.

2. The printed circuit board according to claim 1, wherein:
the common flexible layer stack and the at least one rigidizing layer stack are interconnected with vias.

3. The printed circuit board according to claim 1, further comprising:
a wireless protocol antenna suitable for transreceiving electromagnetic signals comprising a frequency of 2.4 GHz.

4. The printed circuit board according to claim 1, wherein:
it the printed circuit board is foldable into a rectangular shape having two shorter sides and two longer sides, wherein the NFC-antenna borders on one of the shorter sides.

5. The printed circuit board according to claim 1, wherein:
the printed circuit board is foldable into a rectangular shape having two shorter sides and two longer sides, wherein the induction coil is arranged in a center between the shorter sides.

6. The printed circuit board according to claim 2, wherein:
the vias are stiching vias.

7. The printed circuit board according to claim 2, wherein:
the at least one rigidized portion further comprises a second rigidizing layer stack comprising at least one structured metal layer, which forms conductive tracks and/or electrical components, wherein at least a part of the respective at least one structured metal layers of the common flexible layer stack and the two rigidizing layer stacks are interconnected with vias and structured for acting together as the induction coil.

8. The printed circuit board according to claim 7, wherein:
the common flexible layer stack and the two rigidizing layer stacks each comprise two structured metal layers, which are all interconnected with vias and structured for acting together as the induction coil.

9. The printed circuit board according to claim 2, wherein:
the induction coil comprises a surface area of 400 mm$^2$.

10. The printed circuit board according to claim 2, wherein:
the induction coil comprises an overall cross-sectional area of an effective wire formed by the interconnected at least one structured metal layers of the common flexible layer stack and the two rigidizing layer stacks of 0.05-0.3 mm$^2$.

11. The printed circuit board according to claim 1, wherein:
the at least one structured metal layers of the common flexible layer stack and the two rigidizing layer stacks are copper layers.

12. The printed circuit board according to claim 11, wherein:
the copper layers are each ½ oz copper layer.

13. The printed circuit board according to claim 1, wherein:
the NFC-antenna comprises a surface area of 200-250 mm$^2$.

14. The printed circuit board according to claim 4, wherein:
the NFC-antenna comprises a width measured parallel to the shorter sides of 10-20 mm.

15. The printed circuit board according to claim 5, wherein:
the induction coil comprises a width measured parallel to the shorter sides of 10-20 mm.

16. The printed circuit board according to claim 1, wherein:
the induction coil comprises a surface area of 450 mm$^2$.

17. The printed circuit board according to claim 1, wherein:
the induction coil comprises an overall cross-sectional area of an effective wire formed by the interconnected at least one structured metal layers of 0.2 mm$^2$.

18. The printed circuit board according to claim 11, wherein:
the copper layers each comprise a layer thickness of 18 μm.

19. The printed circuit board according to claim 1, wherein:
the NFC-antenna comprises a surface area of 225 mm$^2$.

20. The printed circuit board according to claim 4, wherein:
the NFC-antenna comprises a width measured parallel to the shorter sides of 15 mm.

* * * * *